(12) United States Patent
Kamiyama (10) Patent No.: US 11,348,862 B2
(45) Date of Patent: May 31, 2022

(54) SOURCE ELECTRODE AND CONNECTOR LEAD WITH NOTCHED PORTIONS FOR A SEMICONDUCTOR PACKAGE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Seiichi Kamiyama, Kanazawa Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/013,351

(22) Filed: Sep. 4, 2020

(65) Prior Publication Data
US 2021/0296214 A1    Sep. 23, 2021

(30) Foreign Application Priority Data
Mar. 18, 2020    (JP) .............................. JP2020-047278

(51) Int. Cl.
*H01L 23/495*    (2006.01)
*H01L 23/48*    (2006.01)
(Continued)

(52) U.S. Cl.
CPC .... *H01L 23/49513* (2013.01); *H01L 23/4824* (2013.01); *H01L 23/49524* (2013.01);
(Continued)

(58) Field of Classification Search
CPC ......... H01L 23/49513; H01L 23/49524; H01L 23/49562; H01L 23/49838; H01L 24/32;
(Continued)

(56) References Cited

U.S. PATENT DOCUMENTS 8,264,379 B2 *  9/2012  Whitlow ................ G01C 23/00
                                                              340/980
8,378,468 B2    2/2013  Fujioka et al.
(Continued)

FOREIGN PATENT DOCUMENTS

JP    2013197365 A    9/2013
JP      5535077 B2    7/2014
(Continued)

*Primary Examiner* — Alonzo Chambliss
(74) *Attorney, Agent, or Firm* — Kim & Stewart LLP (57) ABSTRACT

Provided is a semiconductor device including: a semiconductor chip having a rectangular region including a first corner portion having a first notch portion, a second corner portion being provided to diagonally face the first corner portion, a third corner portion, and a fourth corner portion being provided to diagonally face the third corner portion on a surface and having a semiconductor element formed in the rectangular region; a first electrode including a fifth corner portion being provided on the first corner portion and having a second notch portion, a sixth corner portion being provided on the second corner portion, a seventh corner portion being provided on the third corner portion, and an eighth corner portion being provided on the fourth corner portion, the first electrode being provided on the semiconductor element, and the first electrode being electrically connected to the semiconductor element; and a first connector including a ninth corner portion being provided on the fifth corner portion and having a third notch portion and a twelfth corner portion being provided on the eighth corner portion, the first connector being provided on the first electrode, and the first connector being electrically connected to the first electrode.

11 Claims, 5 Drawing Sheets

(51) Int. Cl.
*H01R 9/00* (2006.01)
*H05K 7/18* (2006.01)
*H01L 23/482* (2006.01)
*H01L 23/00* (2006.01)
*H01L 23/498* (2006.01)

(52) U.S. Cl.
CPC .. *H01L 23/49541* (2013.01); *H01L 23/49562* (2013.01); *H01L 23/49838* (2013.01); *H01L 24/29* (2013.01); *H01L 24/32* (2013.01); *H01L 24/37* (2013.01); *H01L 24/40* (2013.01); *H01L 24/83* (2013.01); *H01L 24/84* (2013.01)

(58) Field of Classification Search
CPC ......... H01L 24/29; H01L 24/40; H01L 24/83; H01L 24/37; H01L 24/84; H01L 23/49541; H01L 23/4824
See application file for complete search history.

(56) References Cited

U.S. PATENT DOCUMENTS

| | | | |
|---|---|---|---|
| 9,059,153 | B2 | 6/2015 | Fukui |
| 2002/0033541 | A1* | 3/2002 | Uchida ............... H01L 24/83 257/784 |
| 2009/0001559 | A1* | 1/2009 | Satou ............... H01L 24/97 257/712 |
| 2012/0001342 | A1* | 1/2012 | Sato ............... H01L 24/49 257/773 |
| 2013/0082334 | A1* | 4/2013 | Nakamura ........... H01L 27/088 257/401 |
| 2013/0147064 | A1* | 6/2013 | Sato ............... H01L 23/4952 257/777 |
| 2014/0191334 | A1* | 7/2014 | Xue ............... H01L 24/41 257/401 |
| 2015/0221580 | A1 | 8/2015 | Fukui |
| 2015/0262915 | A1 | 9/2015 | Suzuki |
| 2019/0139866 | A1 | 5/2019 | Kuraya et al. |

FOREIGN PATENT DOCUMENTS

| | | |
|---|---|---|
| JP | 2015144188 A | 8/2015 |
| JP | 2015176916 A | 10/2015 |
| JP | 2019087657 A | 6/2019 |

\* cited by examiner

SOURCE ELECTRODE AND CONNECTOR LEAD WITH NOTCHED PORTIONS FOR A SEMICONDUCTOR PACKAGE

CROSS-REFERENCE TO RELATED APPLICATION

This application is based upon and claims the benefit of priority from Japanese Patent Application No. 2020-047278, filed on Mar. 18, 2020, the entire contents of which are incorporated herein by reference.

FIELD

Embodiments described herein relate generally to semiconductor devices.

BACKGROUND

A semiconductor device having a semiconductor chip such as a metal oxide semiconductor field effect transistor (MOSFET) is used for applications such as power conversion. In a case where the semiconductor device described above is a vertical-type MOSFET, a gate electrode and a source electrode are connected to, for example, a gate metal and a source metal provided on the upper surface of the MOSFET.

DETAILED DESCRIPTION

A semiconductor device according to an embodiment includes: a semiconductor chip having a rectangular region including a first corner portion having a first notch portion, a second corner portion being provided to diagonally face the first corner portion, a third corner portion, and a fourth corner portion being provided to diagonally face the third corner portion on a surface and having a semiconductor element formed in the rectangular region; a first electrode including a fifth corner portion being provided on the first corner portion and having a second notch portion, a sixth corner portion being provided on the second corner portion, a seventh corner portion being provided on the third corner portion, and an eighth corner portion being provided on the fourth corner portion, the first electrode being provided on the semiconductor element, and the first electrode being electrically connected to the semiconductor element; and a first connector including a ninth corner portion being provided on the fifth corner portion and having a third notch portion and a twelfth corner portion being provided on the eighth corner portion, the first connector being provided on the first electrode, and the first connector being electrically connected to the first electrode.

Hereinafter, embodiments will be described with reference to the drawings. In addition, in the following description, the same or similar members and the like are denoted by the same reference numerals, and the description of the members and the like once described is appropriately omitted.

In this specification, in order to illustrate the positional relationship of parts and the like, the upward direction of the drawings may be referred to as "upper", and the downward direction of the drawings may be referred to as "lower". In this specification, the terms "upper" and "lower" do not necessarily indicate the relationship with the direction of gravity.

Embodiment

A semiconductor device according to an embodiment includes: a semiconductor chip having a rectangular region including a first corner portion having a first notch portion, a second corner portion being provided to diagonally face the first corner portion, a third corner portion, and a fourth corner portion being provided to diagonally face the third corner portion on a surface and having a semiconductor element formed in the rectangular region; a first electrode including a fifth corner portion being provided on the first corner portion and having a second notch portion, a sixth corner portion being provided on the second corner portion, a seventh corner portion being provided on the third corner portion, and an eighth corner portion being provided on the fourth corner portion, the first electrode being provided on the semiconductor element, and the first electrode being electrically connected to the semiconductor element; an a first connector including a ninth corner portion being provided on the fifth corner portion and having a third notch portion and a twelfth corner portion being provided on the eighth corner portion, the first connector being provided on the first electrode, and the first connector being electrically connected to the first electrode.

Figure 1:
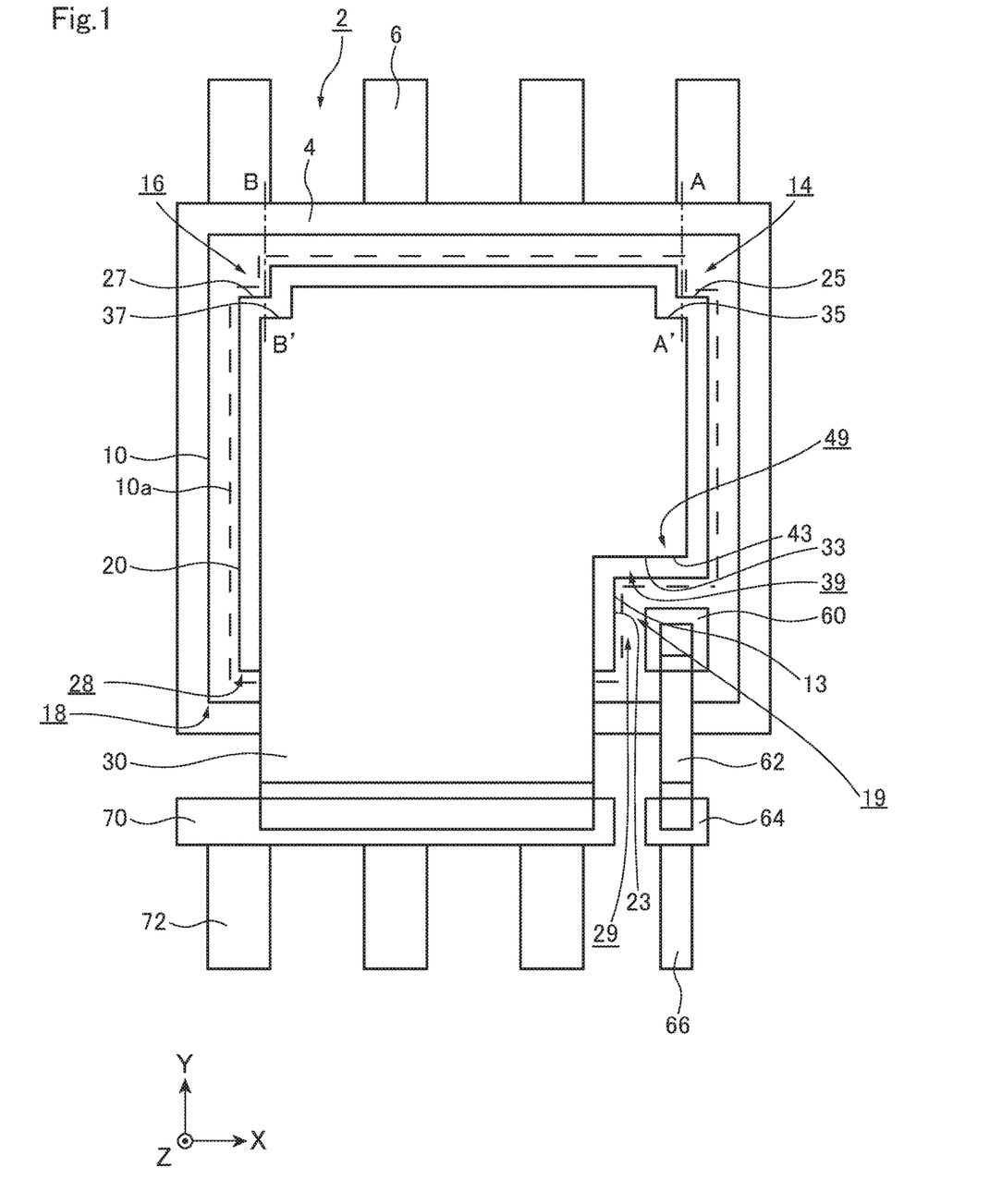
FIG. 1 is a schematic top view of a semiconductor device according to an embodiment.
Figure 2A:
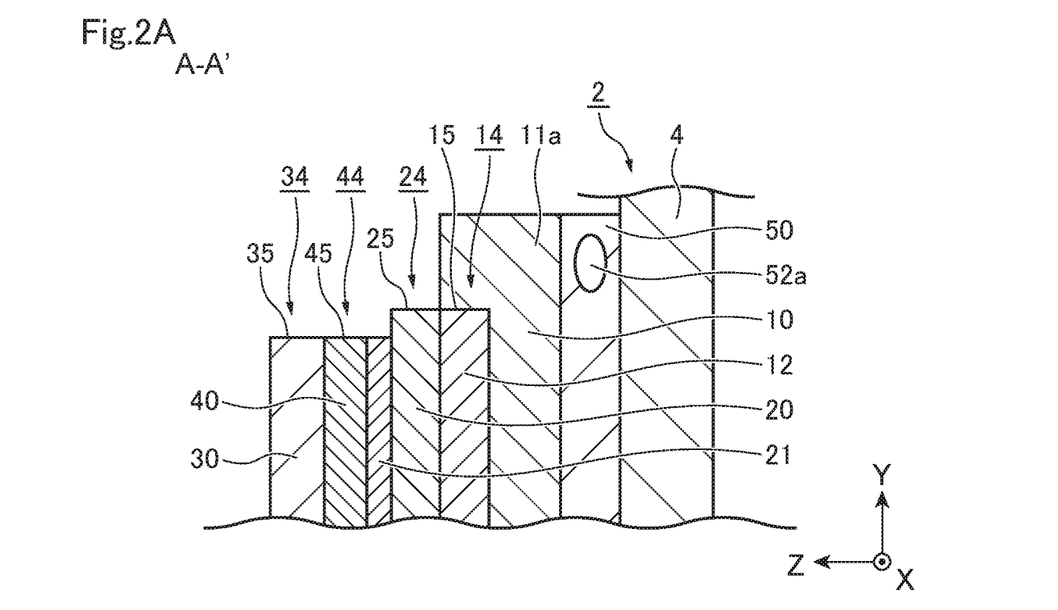
FIGS. 2A and 2B are schematic cross-sectional views of main portions of the semiconductor device according to the embodiment.
Figure 2B:
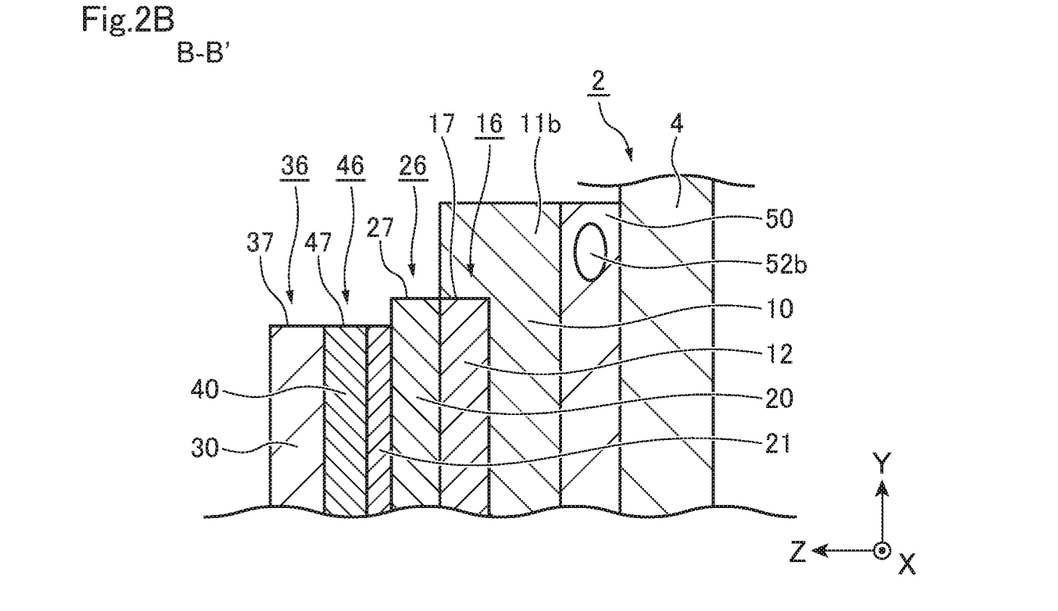

FIG. 1 is a schematic top view of a semiconductor device 100 according to the embodiment. FIGS. 2A and 2B are schematic cross-sectional views of main portions of the semiconductor device 100 according to the embodiment. FIG. 2A is a schematic view of a cross section taken along line A-A' in FIG. 1. FIG. 2B is a schematic diagram of a cross section taken along line B-B' in FIG. 1.

The semiconductor device 100 according to the embodiment will be described with reference to FIG. 1 and FIGS. 2A and 2B.

The semiconductor device 100 includes a die pad 2, a semiconductor chip 10, a source metal (an example of a first electrode) 20, a source connector (an example of a first connector) 30, a first bonding material 40, a second bonding material 50, a gate metal (an example of a second electrode) 60, a gate connector 62, a post portion 64, an outer lead 66, a post portion 70, and an outer lead 72.

The die pad 2 is a plate-shaped member on which the semiconductor chip 10 is disposed and which contains a conductive material such as copper (Cu). The die pad 2 has a bed portion 4 and outer leads 6. The semiconductor chip 10 is disposed on the bed portion 4. The outer leads 6 are connected to the bed portion 4. The outer leads 6 are used to connect the semiconductor chip 10 and an external circuit (not illustrated).

The semiconductor chip 10 is provided on the bed portion 4 of the die pad 2. In other words, the die pad 2 is provided below the semiconductor chip 10. A semiconductor element 12 is formed in a rectangular region 10a on the surface of the semiconductor chip 10. Herein, the semiconductor element 12 is, for example, a vertical-type MOSFET or an insulated gate bipolar transistor (IGBT), but the semiconductor element is not limited thereto. For example, in a case where the semiconductor element is a MOSFET, a drain of the semiconductor element 12 is electrically connected to the bed portion 4 by the second bonding material 50 provided between the semiconductor chip 10 and the die pad 2. Herein, as the second bonding material 50, a conductive resin containing solder or silver particles, or the like is used.

The rectangular region 10a includes a first corner portion 14 having a first notch portion 15, a second corner portion 18 provided to diagonally face the first corner portion 14, a third corner portion 19 having a seventh notch portion 13, and a fourth corner portion 16 having a fourth notch portion 17 provided to diagonally face the third corner portion 19. Then, as described above, the semiconductor element 12 is formed in the rectangular region 10a. No semiconductor element is formed in the first notch portion 15, the seventh notch portion 13, and the fourth notch portion 17.

The source metal 20 is provided on the semiconductor element 12 of the semiconductor chip 10. The source metal 20 contains a conductive material such as Cu or Al (aluminum). For example, in a case where the semiconductor element 12 is a MOSFET, the source metal 20 is electrically connected to a source of the semiconductor element 12. The upper surface of the source metal 20 is plated with a plating material 21 containing, for example, Ni (nickel) and Au (gold).

The source metal 20 includes a fifth corner portion 24 being provided on the first corner portion 14 and having a second notch portion 25, a sixth corner portion 28 being provided on the second corner portion 18, a seventh corner portion 29 being provided on the third corner portions 19 and having an eighth notch portion 23, and an eighth corner portion 26 being provided on the fourth corner portions 16 and having a fifth notch portion 27.

One end of the source connector 30 is provided on the source metal 20 and is electrically connected by the first bonding material 40. Herein, as the first bonding material 40, a conductive resin containing solder or silver particles, or the like is used. The other end of the source connector 30 is provided on the post portion 70 and is electrically connected to the post portion 70. The post portion 70 is electrically connected to the outer lead 72. The source connector 30, the post portion 70, and the outer lead 72 contain a conductive material such as Cu. The outer leads 72 are used to connect the semiconductor chip 10 to an external circuit (not illustrated).

The source connector 30 includes a ninth corner portion 34 being provided on the fifth corner portion 24 and having a third notch portion 35, an eleventh corner portion 39 being provided on the seventh corner portion 29 and having a ninth notch portion 33, and a twelfth corner portion 36 being provided on the eighth corner portion 26 and having a sixth notch portion 37.

Herein, an X direction, a Y direction perpendicular to the X direction, and a Z direction perpendicular to the X and Y directions are defined. The Z direction is a direction in which the bed portion 4, the second bonding material 50, the semiconductor chip 10, the source metal 20, and the first bonding material 40 are stacked. For example, one side of the semiconductor chip 10 is parallel to the X direction, and the other side is parallel to the Y direction.

The first bonding material 40 includes a corner portion 44 (an example of the thirteenth corner portion) being provided on the fifth corner portion 24 and having a tenth notch portion 45, a corner portion 49 being provided on the seventh corner portion 29 and having a notch portion 43, and a corner portion 46 being provided on the eighth corner portion 26 and having a notch portion 47.

For example, as illustrated in FIG. 1, the shape of the second notch portion 25, the shape of the third notch portion 35, the shape of the fifth notch portion 27, and the shape of the sixth notch portion 37 are L-shapes.

The shape of the first notch portion 15 is similar to the shape of the second notch portion 25. For this reason, when viewed from the Z direction, the first notch portion 15 is viewed to overlap the second notch portion 25. In addition, the shape of the fourth notch portion 17 is similar to the shape of the fifth notch portion 27. For this reason, when viewed from the Z direction, the fourth notch portion 17 is viewed to overlap the fifth notch portion 27. The shape of the seventh notch portion 13 is similar to that of the eighth notch portion 23. For this reason, when viewed from the Z direction, the seventh notch portion 13 is viewed to overlap with the eighth notch portion 23.

The shape of the tenth notch portion 45 of the first bonding material 40 is similar to the shape of the third notch portion 35 of the source connector 30. For this reason, when viewed from the Z direction, the tenth notch portion 45 is viewed to overlap the third notch portion 35. In addition, the shape of the notch portion 47 of the first bonding material 40 is similar to the shape of the sixth notch portion 37 of the source connector 30. For this reason, when viewed from the Z direction, the notch portion 47 is viewed to overlap with the sixth notch portion 37. In addition, the shape of the notch portion 43 of the first bonding material 40 is similar to the shape of the ninth notch portion 33 of the source connector 30. For this reason, when viewed from the Z direction, the notch portion 43 is viewed to overlap the ninth notch portion 33.

The size of the first notch portion 15 is equal to, for example, the size of the second notch portion 25. However, the size of the first notch portion 15 may be larger than the size of the second notch portion 25. In other words, the first notch portion 15 may cut into a lower portion of the second notch portion 25. In addition, the size of the fourth notch portion 17 is equal to, for example, the size of the fifth notch portion 27. However, the size of the fourth notch portion 17 may be larger than the size of the fifth notch portion 27. In other words, the fourth notch portion 17 may cut into a lower portion of the fifth notch portion 27.

Furthermore, the semiconductor device 100 includes a gate metal 60 which is separated from the eighth notch portion 23 and the ninth notch portion 33 on the semiconductor chip 10 and is electrically connected to a gate electrode (not illustrated) of the semiconductor element 12. One end of the gate connector 62 is provided on the gate metal 60 and is electrically connected to the gate metal 60. The other end of the gate connector 62 is provided on the post portion 64 and is electrically connected to the post portion 64. The post portion 64 is electrically connected to the outer lead 66. The gate connector 62, the post portion 64, and the outer lead 66 contain, for example, a conductive material such as Cu. The outer leads 66 are used to connect the semiconductor chip 10 and an external circuit (not illustrated).

For example, as illustrated in FIG. 2A, the second bonding material 50 provided between a portion 11a of the semiconductor chip 10 where the semiconductor element 12 is not provided and the die pad 2 may have a void 52a. In addition, as illustrated in FIG. 2B, the second bonding material 50 provided between a portion 11b of the semiconductor chip 10 where the semiconductor element 12 is not provided and the die pad 2 may have a void 52b.

Figure 3A:
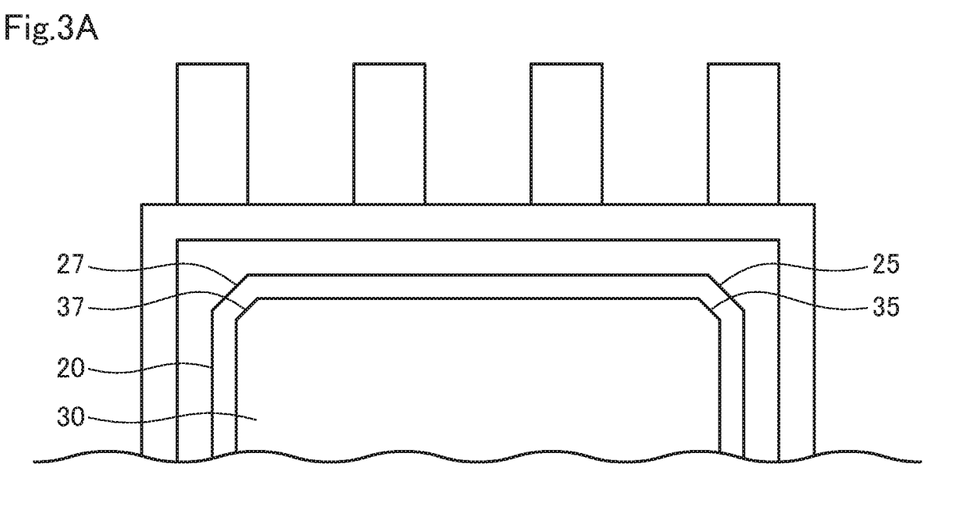
FIGS. 3A and 3B are schematic top views of other examples of the main portions of the semiconductor device according to the embodiment.
Figure 3B:
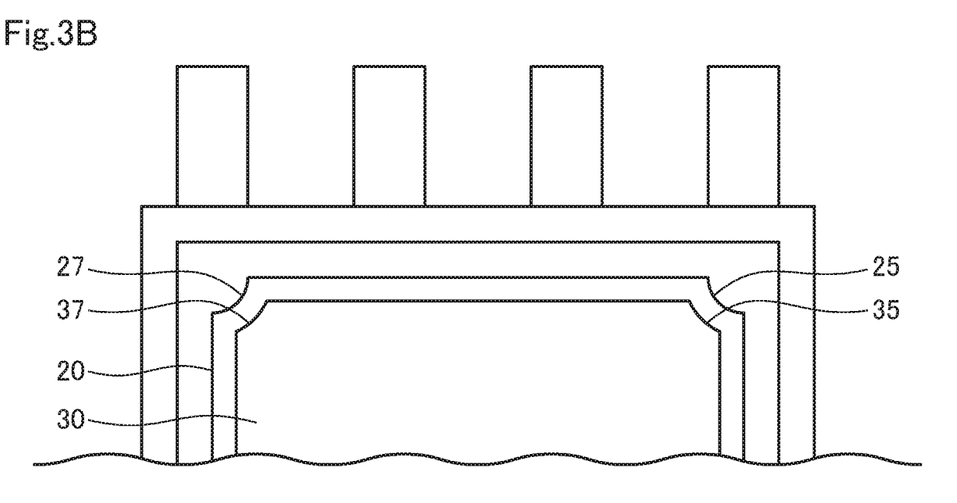

FIGS. 3A and 3B are schematic top views of other examples of the main portions of the semiconductor device 100 according to the embodiment. The shapes of the second notch portion 25 (first notch portion 15), the fifth notch portion 27 (fourth notch portion 17), the third notch portion 35 (tenth notch portion 45), and the sixth notch portion 37 (notch portion 47) are not limited to the shapes illustrated in FIG. 1 and FIGS. 2A and 2B. For example, the shape may be a corner-chamfered shape (bevel edge) as illustrated in FIG. 3A or may be an inverse-round-chamfered shape (inverse round) as illustrated in FIG. 3B.

Next, functions and effects of the semiconductor device 100 according to the embodiment will be described.

Figure 4:
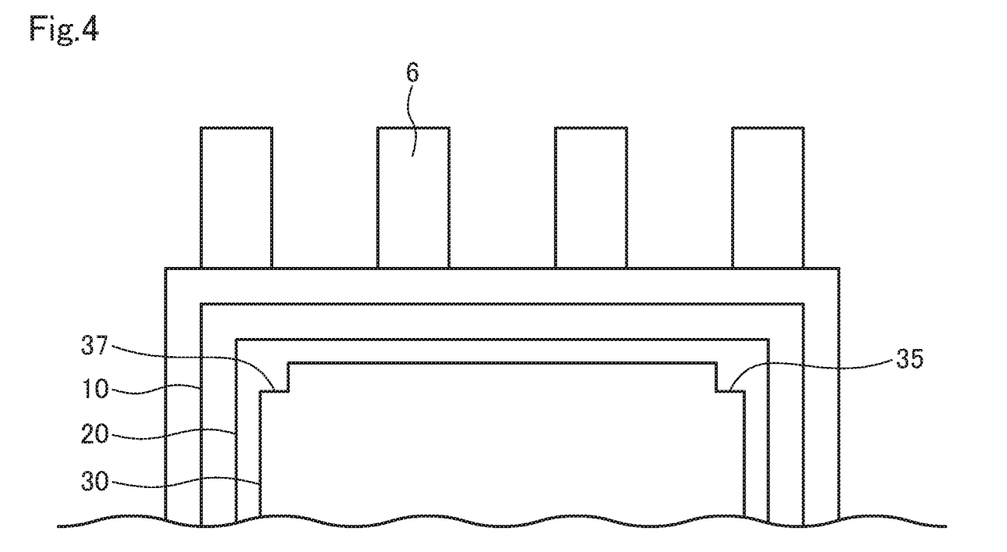
FIG. 4 is a schematic top view of a semiconductor device according to Comparative Example.
Figure 5A:
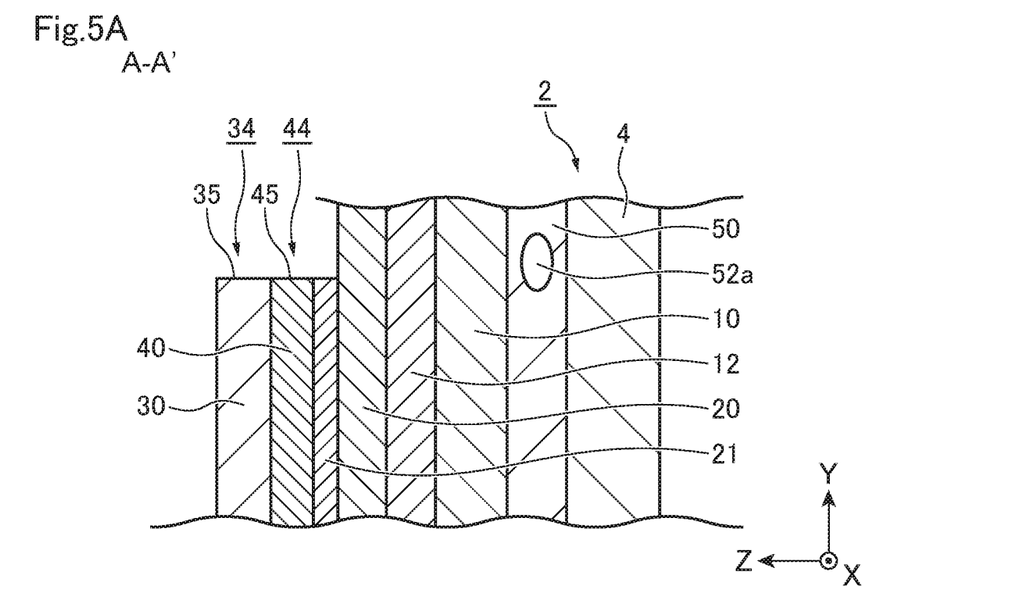
FIGS. 5A and 5B are schematic cross-sectional views of a semiconductor device according to Comparative Example.
Figure 5B:
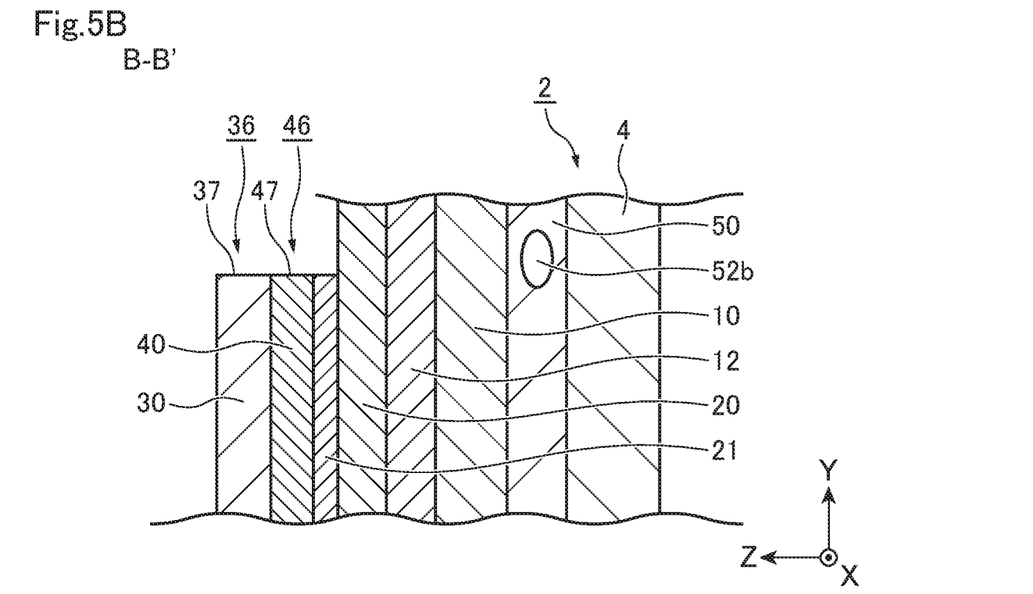

FIG. 4 is a schematic top view of a semiconductor device 800 according to Comparative Example. FIGS. 5A and 5B are schematic cross-sectional views of a semiconductor device 800 according to Comparative Example.

In order to improve contactness between the source metal 20 and the source connector 30 as much as possible, it is considered that the fifth corner portion 24 and the eighth corner portion 26 of the source metal 20 and the ninth corner portion 34 and the twelfth corner portion 36 of the source connector 30 are not provided with a notch portion and the entire upper surface of the source metal 20 is bonded to the source connector 30. Accordingly, the heat generated from the semiconductor element 12 is easily dissipated to the outside of the semiconductor chip 10 through the source metal 20 and the source connector 30. For this reason, the heat dissipation property of the semiconductor chip 10 is improved. However, in a case where, for example, the fifth corner portion 24 and the ninth corner portion 34 have the same shape and, for example, the eighth corner portion 26 and the twelfth corner portion 36 have the same shape, since the source metal 20 and the source connector 30 overlap each other in the corner portions, there is a problem in that it is difficult to bond the source connector to the source metal 20 by position-aligning the source connector 30 with the source metal 20.

In order to solve such a problem, it is considered that notch portions are provided in the ninth corner portion 34 and the twelfth corner portion 36 of the source connector 30. Accordingly, when viewed from the Z direction, since the observation of the fifth corner portion 24 and the eighth corner portion 26 of the source metal 20 is facilitated, the position alignment of the source metal 20 and the source connector 30 is facilitated.

However, as illustrated in FIGS. 5A and 5B, there is considered a case where the voids 52a and the voids 52b exist in the second bonding material 50 under a portion of the source connector 30 that does not exist due to the providing of the third notch portion 35 and the sixth notch portion 37. In this case, since the void 52a and the void 52b are provided, the second bonding material 50 does not exist in that portion. For this reason, the heat dissipation of the semiconductor chip 10 is less likely to be performed through the second bonding material 50. Furthermore, since the source connector 30 is also provided with the third notch portion 35 and the sixth notch portion 37, the heat dissipation of the semiconductor chip 10 is less likely to be performed through the source connector 30. For this reason, there is a problem that heat is concentrated on the semiconductor chip 10 and the semiconductor chip 10 is broken.

Therefore, in the semiconductor device 100 according to the embodiment, the semiconductor element 12 of the semiconductor chip 10 has the first notch portion 15 in the first corner portion 14. In addition, the fourth corner portion 16 has the fourth notch portion 17. Accordingly, since the semiconductor element 12 does not exist in the portion where the third notch portion 35 and the sixth notch portion 37 are provided, heat generation is suppressed. For this reason, the semiconductor chip 10 is less likely to be broken, and thus, it is possible to provide a highly reliable semiconductor device. In addition, in this case, for the electrically connection to the semiconductor element 12 having the first notch portion 15 and the fourth notch portion 17, it is preferable that the source metal 20 has the second notch portion 25 and the fifth notch portion 27. Furthermore, for the bonding of the source metal 20 and the source connector 30, the first bonding material 40 has the tenth notch portion 45 and the notch portion 47.

In addition, in this case, for example, even if the second bonding material 50 provided between the first notch portion 15 and the die pad 2 has a void 52, the semiconductor chip 10 is less likely to be broken.

The shape of the "notch portion" in the embodiment may be an L-shape or may be corner-chamfered. Other shapes may be used and are not particularly limited.

According to the semiconductor device 100 of the embodiment, it is possible to provide a highly reliable semiconductor device.

While certain embodiments have been described, these embodiments have been presented by way of example only, and are not intended to limit the scope of the inventions. Indeed, semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor chip having a rectangular region including a first corner portion having a first notch portion, a second corner portion being provided to diagonally face the first corner portion, a third corner portion, and a fourth corner portion being provided to diagonally face the third corner portion on a surface and having a semiconductor element formed in the rectangular region;
   a first electrode including a fifth corner portion being provided on the first corner portion and having a second notch portion, a sixth corner portion being provided on the second corner portion, a seventh corner portion being provided on the third corner portion, and an eighth corner portion being provided on the fourth corner portion, the first electrode being provided on the semiconductor element, and the first electrode being electrically connected to the semiconductor element; and
   a first connector including a ninth corner portion being provided on the fifth corner portion and having a third notch portion and a twelfth corner portion being provided on the eighth corner portion, the first connector being provided on the first electrode, and the first connector being electrically connected to the first electrode;
   wherein the rectangular region has a seventh notch portion in the third corner portion,
   wherein the first electrode has an eighth notch portion in the seventh corner portion, wherein the first connector has a ninth notch portion in an eleventh corner portion provided on the seventh corner portion, and wherein a second electrode electrically connected to the semiconductor element is further included on the semiconductor chip to be separated from the eighth notch portion and the ninth notch portion.

2. The semiconductor device according to claim 1, wherein the rectangular region has a fourth notch portion in the fourth corner portion, wherein the first electrode has a fifth notch portion in the eighth corner portion, and wherein the first connector has a sixth notch portion in the twelfth corner portion.

3. The semiconductor device according to claim 1, further comprising a first bonding material being provided between the first electrode and the first connector, the first bonding material bonding the first electrode and the first connector, and the first bonding material having a tenth notch portion in a thirteenth corner portion on the fifth corner portion.

4. The semiconductor device according to claim 1, further comprising:
a die pad being provided under the semiconductor chip; and
a second bonding material being provided between the die pad and the semiconductor chip and bonding the die pad and the semiconductor chip.

5. The semiconductor device according to claim 1, wherein shapes of the first notch portion, the second notch portion, and the third notch portion are L-shapes.

6. The semiconductor device according to claim 1, wherein shapes of the first notch portion, the second notch portion, and the third notch portion are corner-chamfered shapes.

7. The semiconductor device according to claim 1, wherein a size of the first notch portion is equal to a size of the second notch portion.

8. A semiconductor device comprising:
a semiconductor chip having a rectangular region including a first corner portion having a first notch portion, a second corner portion being provided to diagonally face the first corner portion, a third corner portion, and a fourth corner portion being provided to diagonally face the third corner portion on a surface and having a semiconductor element formed in the rectangular region;
a first electrode including a fifth corner portion being provided on the first corner portion and having a second notch portion, a sixth corner portion being provided on the second corner portion, a seventh corner portion being provided on the third corner portion, and an eighth corner portion being provided on the fourth corner portion, the first electrode being provided on the semiconductor element, and the first electrode being electrically connected to the semiconductor element;
a first connector including a ninth corner portion being provided on the fifth corner portion and having a third notch portion and a twelfth corner portion being provided on the eighth corner portion, the first connector being provided on the first electrode, and the first connector being electrically connected to the first electrode;
a die pad being provided under the semiconductor chip; and
a second bonding material being provided between the die pad and the semiconductor chip and bonding the die pad and the semiconductor chip,
wherein the second bonding material provided between a portion of the semiconductor chip with the semiconductor element not provided and the die pad has a void.

9. The semiconductor device according to claim 8, wherein shapes of the first notch portion, the second notch portion, and the third notch portion are L-shapes.

10. The semiconductor device according to claim 8, wherein shapes of the first notch portion, the second notch portion, and the third notch portion are corner-chamfered shapes.

11. The semiconductor device according to claim 8, wherein a size of the first notch portion is equal to a size of the second notch portion.

* * * * *